United States Patent
Elías et al.

(10) Patent No.: US 11,810,953 B2
(45) Date of Patent: Nov. 7, 2023

(54) SENSOR HAVING GRAPHENE TRANSISTORS

(71) Applicant: Graphenea Semiconductor SLU, Donostia-San Sebastián (ES)

(72) Inventors: Torres Elías, Donostia-San Sebastián (ES); Txoperena Oihana, Donostia-San Sebastián (ES); Zurutuza Amaia, Donostia-San Sebastián (ES)

(73) Assignee: GRAPHENEA SEMICONDUCTOR SLU, Donostia-San Sebastián (ES)

( * ) Notice: Subject to any disclaimer, the term of this patent is extended or adjusted under 35 U.S.C. 154(b) by 288 days.

(21) Appl. No.: 17/248,477

(22) Filed: Jan. 26, 2021

(65) Prior Publication Data
US 2022/0136996 A1    May 5, 2022

(30) Foreign Application Priority Data

Nov. 5, 2020 (EP) .................................... 20382961

(51) Int. Cl.
*H01L 29/16* (2006.01)
*G01N 27/30* (2006.01)
(Continued)

(52) U.S. Cl.
CPC ....... *H01L 29/1606* (2013.01); *G01N 27/308* (2013.01); *G01N 27/4145* (2013.01);
(Continued)

(58) Field of Classification Search
None
See application file for complete search history.

(56) References Cited

U.S. PATENT DOCUMENTS 9,823,218 B2 * 11/2017 Klootwijk .......... G01N 27/4145
10,224,499 B2 * 3/2019 Wu ...................... H01L 31/0288
(Continued)

FOREIGN PATENT DOCUMENTS

CN 107167608 A * 9/2017 ......... G01N 27/3275
EP 3045902 7/2016
(Continued)

OTHER PUBLICATIONS

European Search Report from the European Patent Office issued in corresponding Application No. EP20382961 dated Mar. 31, 2021.
(Continued)

*Primary Examiner* — Scott B Geyer
(74) *Attorney, Agent, or Firm* — NORTON ROSE FULBRIGHT US LLP

(57) ABSTRACT

A sensor for performing measurements is disclosed. It comprises: a substrate; a plurality of graphene field-effect transistors (GFET) deposited on a central area of the substrate; at least one source electrode connected to the GFETs through at least one first metal track, wherein the at least one source electrode is disposed at the periphery of the substrate; at least one drain electrode connected to the GFETs through at least one second metal track, wherein the at least one drain electrode is disposed at the periphery of the substrate; and at least one gate electrode, disposed at least in part at the center of the substrate, wherein, in use of the sensor, when a sample is deposited in contact with the gate electrode and the GFETs, the sample allows gating between the gate electrode and the GFETs.

14 Claims, 10 Drawing Sheets

(51) Int. Cl.
*G01N 27/414* (2006.01)
*H01L 23/535* (2006.01)
*H01L 29/417* (2006.01)
*H01L 29/786* (2006.01)

(52) U.S. Cl.
CPC ...... *H01L 23/535* (2013.01); *H01L 29/41733* (2013.01); *H01L 29/78696* (2013.01)

(56) References Cited

U.S. PATENT DOCUMENTS

| | | | |
|---|---|---|---|
| 10,541,348 B2* | 1/2020 | White | H01L 31/113 |
| 2014/0292381 A1* | 10/2014 | Appenzeller | H03B 19/14 |
| | | | 327/119 |
| 2017/0315075 A1* | 11/2017 | Akinwande | G01N 33/0054 |
| 2017/0350882 A1* | 12/2017 | Lin | G01N 33/54353 |
| 2018/0321184 A1* | 11/2018 | Mackin | H01L 29/22 |
| 2019/0086327 A1* | 3/2019 | Atsuta | G01N 33/0047 |
| 2019/0181273 A1* | 6/2019 | Van Rooyen | H01L 29/42384 |
| 2019/0182444 A1* | 6/2019 | Allen | H04N 25/63 |
| 2019/0257732 A1* | 8/2019 | Gudibande | G01N 33/6845 |
| 2019/0339246 A1* | 11/2019 | Johnson, Jr. | G01N 27/4145 |
| 2020/0248173 A1* | 8/2020 | Paytavi | B01L 3/502761 |
| 2020/0256826 A1* | 8/2020 | Chen | G01N 27/4146 |
| 2020/0326300 A1* | 10/2020 | Aran | C12Q 1/6834 |
| 2021/0048407 A1* | 2/2021 | Johnson, Jr. | G01N 27/411 |
| 2021/0140919 A1* | 5/2021 | Burch | G01N 27/4146 |
| 2021/0193801 A1* | 6/2021 | Wang | H01L 29/401 |
| 2021/0217745 A1* | 7/2021 | Allen | H03K 17/162 |

FOREIGN PATENT DOCUMENTS

| | | | | |
|---|---|---|---|---|
| EP | 3131121 | | 2/2017 | |
| KR | 20160134111 | | 11/2016 | |
| WO | WO-2011158836 A1 | * | 12/2011 | ......... G01N 27/4145 |
| WO | WO-2014060896 A1 | * | 4/2014 | ......... G01N 27/4145 |

OTHER PUBLICATIONS

Sun et al., "Matrix Effect Study and Immunoassay Detection Using Electrolyte-Gated Graphene Biosensor", *Micromachines (Basel)*, 9(4):142, 2018.

* cited by examiner

SENSOR HAVING GRAPHENE TRANSISTORS

CROSS-REFERENCE TO RELATED APPLICATIONS

This application claims the benefit of priority of European Patent Application No. 20382961.9 filed Nov. 5, 2020, which is hereby incorporated by reference in its entirety.

TECHNICAL FIELD

The present invention relates to the field of electronic analysis of samples, such as chemical or biological samples. In particular, it relates to devices for electronic analysis of samples, comprising graphene transistors.

STATE OF THE ART

There exist different diagnostic techniques oriented to detecting diseases or ailments, such as viral or bacterial infections, cancer tumors, organ failures or even genetically inherited diseases, such techniques based on chromatography, such as enzyme-linked immunosorbent assays (ELISA), fluorescence-based tests which, together with emerging photonic devices, offer great sensitivity and selectivity, but require complex readout and dedicated equipment to transduce the optical signal in an electrical one; and the nowadays diagnosis workhorse, the Polymerase Chain Reaction (PCR) technique, which is highly sensitive and reliable, but which is slow (hours to get a result) and therefore unsuitable in situations requiring fast diagnosis and needs of a centralized lab for sample processing which complicates the logistics of mass-screening diagnostics. Among existing diagnostic techniques, Point-of-care (POC) testing, also referred to as bedside testing, refers to medical diagnostic testing performed at or near the point of care—that is, at the time and place of patient care.

Since its recent discovery, graphene has attracted much attention due to its properties, such as high electronic mobility, extraordinary thermal conductivity, great strength, flexibility and transparency. Due to these properties, many diverse uses and applications have been researched, such as transparent conductive electrodes and photoactive layers in optoelectronics, Hall-effect sensors for low-magnetic field sensing and copper interconnects replacements in Very Large Scale Integration (VLSI) semiconductor processes, to name a few. However, it is probable in the field of biosensing, biotechnology and healthcare where graphene's disruption potential will be showcased first. The monolayer structure of graphene allows it to be sensitive to electrostatic perturbations at its surface. The observation of this sensitivity has enabled the development of graphene-based chemical and biological sensors, whose operation is based on the change in electrical properties when exposed to a targeted chemical or biological agent.

Graphene sensors have immense potential for disrupting the diagnosis—and thus healthcare—sector, among other sectors. For instance, graphene field-effect transistors (GFET) have been employed for the detection of COVID-19 in nasopharingeal samples (ACS Nano 2020, 14(4), 5135-5142. DOI 10.1021/acsnano.0c02823), multiple-ion sensing (Nature Communications (2020) 11:3226 DOI: 10.1038/s41467-020-16979-y) and glucose level monitoring (Yong Liu et al, Biocompatible Graphene Oxide-Based Glucose Biosensors, Langmuir Letter, 2010).

As mentioned previously, the monoatomic nature of graphene allows it to be an ultra-sensitive material to perturbations at its surface. This ultrasensitivity can be selective if the graphene is functionalized with the right molecules and bioconjugates, that create specific binding sites for the biomarkers of choice to be bond to. For this, one needs to functionalize the surface of the GFETs with the appropriate linker, which usually is either a compound containing aromatic groups such as a polycyclic aromatic hydrocarbon (PAH) or an organic molecule with a functional group (amino, thiol, etc.) attached to the other end. This functional group will be used to anchor the probe or receptor molecule.

These linkers bind either covalently or non-covalently to the graphene surface, undergoing immobilization. This linker creates active sites for the probe or receptor molecule of choice, which binds through the functional group. Alternatively, the probe molecule can be deposited directly onto the graphene without using a linker molecule. This probe molecule has specificity for a certain biomarker. After the probe molecule is attached to the linkers, the graphene surface is cleaned in a buffer solution. Passivation may be applied in order to passivate the graphene surface not attached to the linker. This enhances the sensitivity and specificity of the sensor. When the biomarker of choice interacts with the probe molecule, they bind, producing a change in the electronic state of the probe and linker molecule. This produces a charge transfer into the graphene channel which changes its conductivity. This results in a change in the conductance of graphene and thus a change in the current flowing through the transistor, which is the output signal. The benefit of an electrical readout against chromatographic or optical schemes is the well-known established techniques for electrical analysis that enable clear readout of the signal. The data could be potentially be used to feed a neural network or an artificial intelligence algorithm capable of further enhancing the statistical analysis of the data. These unparalleled features of the GFETs make them ideal for biosensors. Specially, these attributes make the GFETs the ideal platform for POC diagnostic devices.

US2018/0275084A1 discloses a sensor comprising a graphene film having an opening, to the edges of which probe molecules are bonded. U.S. Pat. No. 9,618,476B2 discloses a biological sample sensor comprising a plurality of graphene field-effect transistors. In the sensor disclosed in U.S. Pat. No. 9,618,476B2, transistors are located within wells to concentrate a biological sample over the transistors. Wells include biomolecules for detection of a particular antibody. Graphene is directly covalently bonded to a biomarker.

DESCRIPTION OF THE INVENTION

The present invention provides an improved sensor to conventional graphene sensors. The sensor of the present invention is an electronic system (chip) for performing biological or chemical sample analysis. The sensor may also be referred to as an electronic sample sensor system. Due to the unprecedented sensitivity of graphene field-effect transistors (GFETs) to the surrounding environments, the sensor is an ideal transducer for a variety of sensing applications. Depending on the application, the sensor can be tuned to be sensitive only to the stimulus of interest. The sensor has shown breakthrough performance in different areas, such as biosensors, chemical sensors, bioelectronics, photodetectors and magnetic sensors. Due to the specific configuration of GFETs and contact electrodes within the sensor, the sensor of the invention can be handled and manipulated easily.

Because it has a clear separation between the area configured to receive a sample—such as a liquid sample- and the contact electrodes, accurate and reliable measurements can be performed. The multiple graphene channels allows for signal multiplexing and averaging, which dramatically improves reproducibility and device-to-device variations. This is of special interest in POC testing, essential for example in pandemic scenarios.

In a first aspect of the present invention, a sensor for performing measurements is provided. The sensor comprises: a substrate; a plurality of graphene field-effect transistors (GFET) deposited on a central area of the substrate; at least one source electrode connected to the GFETs (that is to say, to the source contact of each GFET) through at least one first metal track, wherein the at least one source electrode is disposed at the periphery of the substrate; at least one drain electrode connected to the GFETs (that is to say, to the drain contact of each GFET) through at least one second metal track, wherein the at least one drain electrode is disposed at the periphery of the substrate; and at least one gate electrode disposed at least in part at the center of the substrate, wherein, in use of the sensor, when a sample is deposited in contact with the gate electrode and the GFETs, the sample allows gating between the gate electrode and the GFETs. The sample may be a liquid sample, in which case the sample allows liquid gating between the gate electrode and the GFETs.

In the context of the present invention, the term "periphery" and its derivates ("peripheral", etc.) refer to an area of the die located in the vicinity of the perimeter of the die. For example, considering a die having size of 10 mm×10 mm, the maximum distance between the most distal point in a peripheral area of the die surface and the perimeter of the die is 2 mm, such as 1.5 mm or 1 mm. In turn, the term "center" and its derivates ("central", etc.) refer to an area of a die which does not belong to the peripheral area, such as an area located in the vicinity of the central point of the die surface. For example, considering a die having size of 10 mm×10 mm, the minimum distance between any point in a central area and the perimeter of the die is 2 mm, such as 2.5 mm, 3 mm, 3.5 mm or 4 mm.

In embodiments of the invention, the substrate is made of at least one of silicon, silicon oxide, glass, quartz or polymeric material.

In embodiments of the invention, the at least one first metal track and the at least one second metal track are encapsulated. In embodiments of the invention, encapsulation comprises at least one of alumina and titanium oxide.

In embodiments of the invention, the GFETs are disposed forming a first row and a second row of GFETs; and the at least one gate electrode is disposed between the first row and the second row of GFETs.

In embodiments of the invention, the sensor comprises two drain electrodes, wherein a first drain electrode is connected to all the GFETs of the first row of GFETs, and a second drain electrode is connected to all the GFETs of the second row of GFETs.

In embodiments of the invention, the sensor comprises one drain electrode connected to all the GFETs of the first row of GFETs and of the second row of GFETs.

In embodiments of the invention, the GFETs are disposed forming three groups of GFETs in a corresponding quadrant or quarter of the substrate; and there are four gate electrodes, each of them being partly located at the center of the substrate, in the vicinity of each corresponding group of GFETs; and partly located at the periphery of the substrate.

In embodiments of the invention, the sensor comprises a plurality of source electrodes, wherein each source electrode is connected to a respective GFET of the plurality of GFETs, through a respective first metal track, in such a way that each GFET has an independent source contact.

In embodiments of the invention, the plurality of source electrodes is disposed forming two rows of source electrodes, the first row being disposed at a first end of the substrate and the second row being disposed at a second end of the substrate, opposite to the first end thereof.

In embodiments of the invention, the sensor comprises a plurality of source contacts, wherein all the source contacts of said plurality of source contacts are electrically connected to each other through a metal track, in such a way that all the GFETs share a common source.

In embodiments of the invention, the sensor comprises a single drain electrode connected to all the GFETs of the plurality of GFETs, in such a way that all the GFETs share a common drain.

In embodiments of the invention, the at least one gate electrode is not in physical contact with the GFETs. The at least one gate electrode is capacitively coupled (through the gate contact of the GFET) to the graphene layer of the GFETs.

In embodiments of the invention, the sensor further comprises at least one probe molecule bonded to the GFETs, such that if the at least one probe molecule is exposed to a biological sample comprising a biomarker while voltage is applied to the GFETs, the conductance of the GFETs changes. In embodiments of the invention, the at least one probe molecule is bonded to the GFETs through a linker molecule, such that if the probe is exposed to a biological sample (blood, urine, saliva, serum, etc.) containing the biomarker in a liquid medium while voltage is applied to the GFETs, the conductance of the GFETs changes as a consequence of the reaction between the probe molecule and the biomarker. The biomarker may be an antibody, an enzyme, a protein, a virus, an antigen, a pathogen, or a volatile organic compound, among others. The probe molecule may be an antibody, an enzyme, a protein, a virus, an antigen, a pathogen, etc. The linker molecule may be an organic molecule containing aromatic molecules having a non-covalent link to the graphene or an organic molecule having a covalent link to the graphene. The linker has a functional group for anchoring or attaching the probe molecule. Suitable functional groups include amino, thiol, activated esters, carboxy, etc. Specially interesting are activated esters such as N-hydroxysuccinimide esters for the modification of amino groups present in proteins, antibodies, viruses, etc.

In a second aspect of the present invention, a wafer is provided. The wafer comprises a plurality of sensors according to the first aspect of the invention.

Additional advantages and features of the invention will become apparent from the detailed description that follows and will be particularly pointed out in the appended claims.

BRIEF DESCRIPTION OF THE DRAWINGS

To complete the description and in order to provide for a better understanding of the invention, a set of drawings is provided. Said drawings form an integral part of the description and illustrate an embodiment of the invention, which should not be interpreted as restricting the scope of the invention, but just as an example of how the invention can be carried out. The drawings comprise the following figures.

DESCRIPTION OF A WAY OF CARRYING OUT THE INVENTION

The following description is not to be taken in a limiting sense but is given solely for the purpose of describing the broad principles of the invention. Next embodiments of the invention will be described by way of example, with reference to the above-mentioned drawings showing apparatuses and results according to the invention.

Sensor chips according to the invention are designed for measurements in liquid medium. Each sensor provides a plurality of graphene devices. Probe pads (also referred to as contacts or electrodes) are located near the periphery of the chip. Metal tracks (paths) connect the graphene devices and the electrodes. An additional electrode is located at least partially at the center of the chip. It allows liquid gating without requiring an external gate electrode, which is integrated in the chip. The sensors are disclosed in detail next.

Figure 1A:
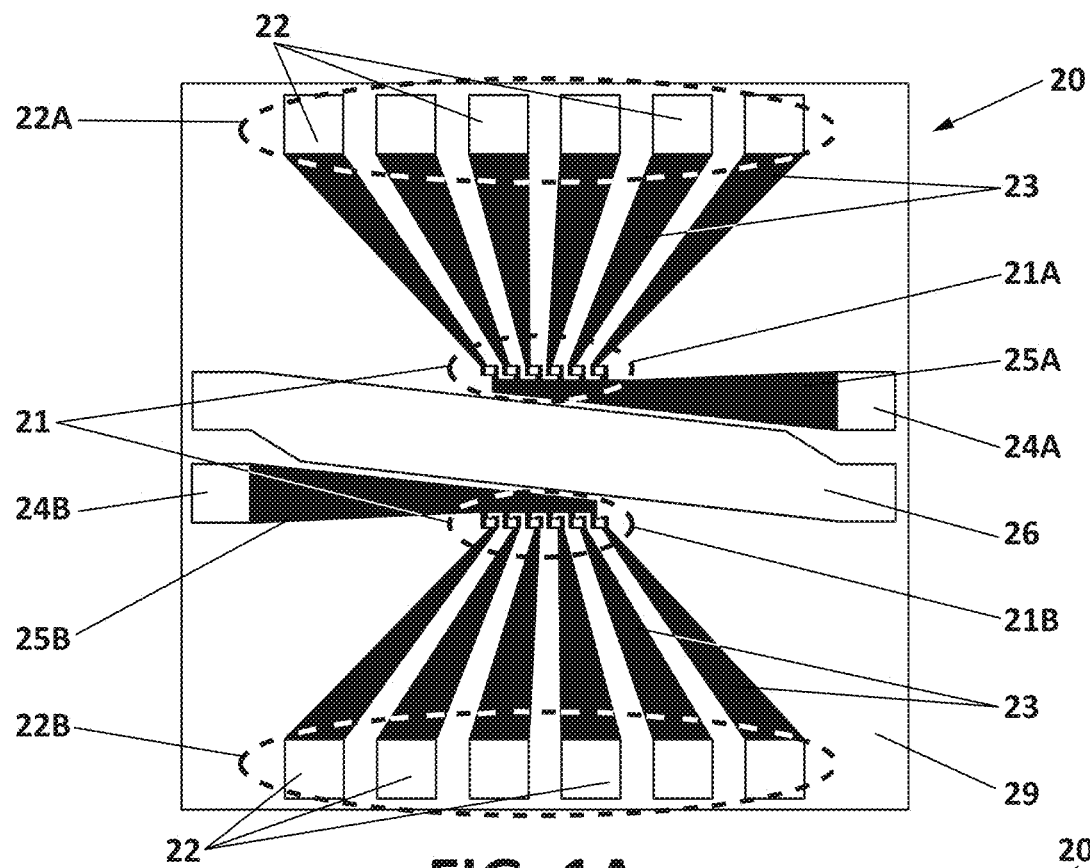
FIGS. 1A, 1B and 1C illustrate respective sensors comprising a plurality of GFETs, according to embodiments of the invention.
Figure 8A:
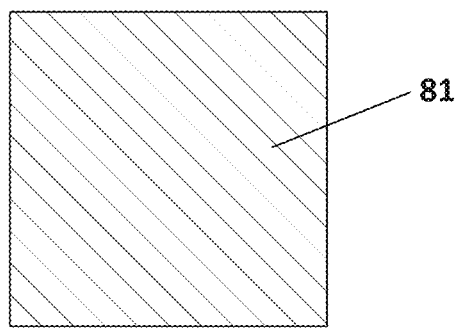
FIGS. 8A-8H schematically represent the manufacturing process of a sensor as disclosed in the embodiments of FIGS. 1A-1C and 2.
Figure 8C:
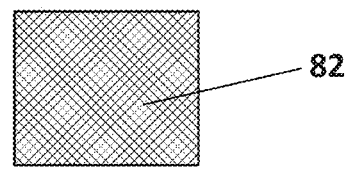
Figure 8B:
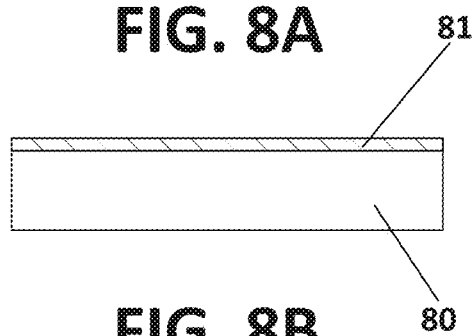
Figure 8D:
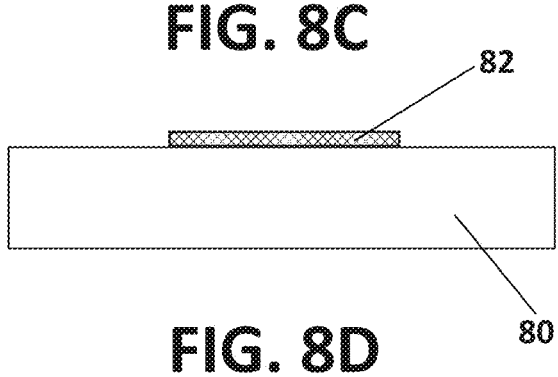
Figure 8E:
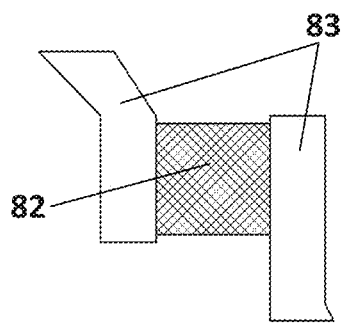

FIGS. 1A, 1B, 1C and 2 illustrate different embodiments of a top view of the GFET sensor chip of the invention. GFET sensor 20 shown in FIG. 1A is made on a die whose lateral dimensions vary between 2 and 20 mm (millimeter, $10^{-3}$ meters). The sensor is built in a chip in turn manufactured on a substrate 29. Substrate 29 may be formed by two layers (upper layer and lower layer). Lower layer may be made of one of silicon, silicon oxide, glass, quartz and polymeric material. For example, substrate 29 may be formed by a silicon dioxide layer deposited on a silicon substrate layer, in turn obtained from doped silica (n++Si). The thickness of the silicon dioxide layer may be of 50-400 nm. For example, it may be of 90 nm or of 300 nm. Sensor 20 includes a plurality of graphene devices (graphene transistors, GFET) 21 located in a central area of the chip. Graphene devices are obtained from a layer of graphene (also referred to as graphene film) disposed on the substrate 29. Each graphene field-effect transistor has at least one graphene channel (also referred to as graphene layer), a source contact, a drain contact and a gate contact. The gate contact is capacitively coupled to the graphene channel. In each graphene device 21, the graphene layer (or portion of graphene layer) is connected with 2 electrodes (sensor electrodes) on opposite sides, namely the source and drain electrodes, which allow for current to be injected into and collected from the graphene channel. A side view of a graphene device is schematically shown in FIG. 8H, which will be explained in detail when a manufacturing process is detailed. In FIG. 8H, a graphene device 82 is deposited or grown on a substrate 80, and two electrodes 83 are connected to two sides (opposite sides) of the graphene device. Encapsulation 74, 75 is also shown.

Each GFET 21 (82 in FIG. 8H) is connected to a first sensor electrode and to a second sensor electrode (sensor electrodes 83 in FIG. 8H) provided on the substrate 29. One of the first sensor electrode and the second sensor electrode functions as a drain electrode, and the other functions as a source electrode. The first sensor electrode and the second sensor electrode come in electrical contact with the graphene film forming each GFET 21 through respective drain and source contacts of the GFET. Electric current can flow between the first electrode and the second electrode via the graphene film. In FIG. 1A, source sensor electrodes for different GFETs 21 are electrodes 22 (22A, 22B); and drain sensor electrodes for different GFETs 21 are electrodes 24A, 24B.

The graphene layer is preferably high-quality monolayer CVD graphene. The GFETs 21 are disposed forming two parallel rows 21A, 21B of graphene devices in a central area of the die. The amount of graphene devices 21 may vary between 8 and 24 devices, each of the two rows 21A, 21B therefore having an amount of 4 to 12 graphene devices. In a particular implementation, the sensor 20 has 12 GFETs disposed in two parallel rows of 6 GFET per row. The graphene channels (semiconductor), the silicon dioxide layer (oxide) and the doped silicon substrate (metal) form a Metal/Oxide/Semiconductor structure. This structure is also seen as a silicon transistor or Metal Oxide Semiconductor Field Effect Transistor (MOSFET), from where the GFETs take their name from.

Sensor 20 also includes, in its periphery, a plurality of electrodes 22 (also referred to as probe pads or contacts), each of which corresponding to the source electrode (source contact) of a corresponding GFET 21. Electrodes 22 are therefore also referred to as source electrodes. Each electrode 22 is connected to a corresponding GFET 21 through a metal track 23.

In the shown embodiment, source electrodes 22 are disposed forming two parallel rows 22A, 22B of electrodes disposed at opposite sides at the periphery of the chip 20. There are as many source electrodes 22 as graphene devices 21. In the particular implementation in which there are 12 GFETs 21 disposed in two parallel rows, there are consequently 12 source electrodes 22, preferably disposed in two parallel rows 22A, 22B of 6 electrodes per row: a first row of source electrodes 22A disposed at a first side of the chip 20, at the periphery thereof, and a second row of source electrodes 22B disposed at a second side of the chip 20, at the periphery thereof, opposite to the first side thereof. Therefore, each graphene transistor 21 has an independent source contact. Each graphene transistor 21 is connected to a corresponding source electrode 22 through a respective metal track 23.

Sensor 20 also includes, in its periphery, one or more electrodes 24A, 24B (also referred to as probe pads or contacts), connected to the drain electrode (drain contact) of the GFETs 21. Electrodes 24A, 24B are therefore referred to as drain electrodes. In a particular embodiment, as shown in FIG. 1A, sensor 20 has a first drain electrode 24A acting as drain contact for all the graphene transistors of the first row of transistors 21A, and a second drain electrode 24B acting as drain contact for all the graphene transistors of the second row of transistors 21B. Drain electrodes 24A, 24B are preferably disposed at opposite sides of the chip 20, in particular at the sides thereof not occupied by the two parallel rows 22A, 22B of source electrodes 22. Each drain electrode 24A, 24B is connected to the GFETs 21 of a corresponding row of GFETs 21A, 21B, through a respective metal track 25A, 25B, shared by all the transistors in the row.

Metal tracks 23, 25A, 25B extend from the central area of the chip (in particular, from a graphene transistor 21, with which each metal track contacts) to the periphery of the chip. Metal tracks 23, 25A, 25B are preferably encapsulated—covered with a dielectric material, either organic or inorganic—in order to avoid degradation and to reduce leakage currents. This encapsulation can be polymeric. Non-limiting examples of polymers that can be used as encapsulation are glutarimide-based resins and phenol formaldehyde-based resins. Encapsulation can also be non-polymeric. For example, encapsulation can be made with non-organic materials, such as oxides. Non-liming examples of non-organic materials that can be used as encapsulation are alumina ($Al_2O_3$), hafnium oxide ($HfO_2$), silicon nitride ($Si_3N_4$), silicon oxide ($SiO_2$), titanium oxide ($TiO_2$) and zirconium oxide ($ZrO_2$). In a particular embodiment, metal tracks 23, 25 have double encapsulation: a first encapsulation layer is made of alumina ($Al_2O_3$) and a second encapsulation layer is made of $TiO_2$, which is deposited atop of the first alumina layer. Alumina encapsulation acts as a $O_2$ moisture barrier. $TiO_2$ capping acts as a biocompatible layer, allowing biocompatible interaction with the sample. Outer electrodes 22A-22B, 24A-24B (source and drain electrodes) are not encapsulated.

Figure 1B:
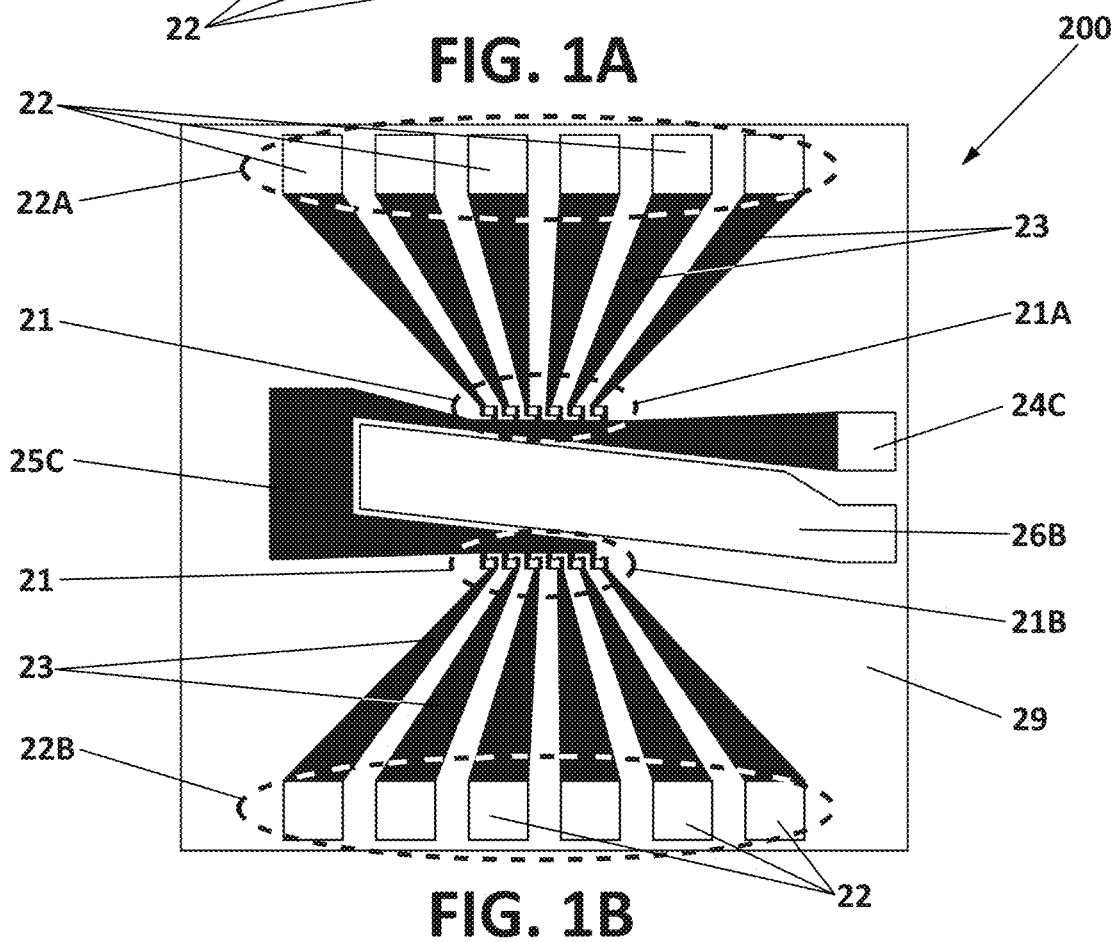

FIG. 1B shows a particular embodiment of a sensor 200, which is very similar to sensor 20. However, sensor 200 differs from sensor 20 in that sensor 200 has a single drain electrode 24C, acting as drain contact for all the graphene transistors 21. In this case, the drain electrode 24C is disposed at a side of the chip, at the periphery thereof, preferably at a side not occupied by the two parallel rows 22A, 22B of source electrodes 22. In this case, the drain electrode 24C is connected to the GFETs 21 through a single metal track 25C shared by all transistors 21. Metal/graphene interface is also encapsulated. Since all the GFETs 21 (in two rows) need to be connected to the drain contact 24C through metal track 25C, metal track 25C extends from drain contact 24C, substantially in parallel to electrode 26B (therefore contacting all the GFETs in the first row 21A), surrounds electrode 26B and extends again parallel thereto until track 25C is connected to all transistors in the second row 21B.

Sensor 20, 200 includes another non-encapsulated electrode 26, 26B, disposed at least in part at the center of the chip. This electrode 26, 26B allows gating (such as liquid gating) without the need of an external gate electrode. This simplifies considerably the operation of the sensor. Therefore, electrode 26, 26B is a gate electrode, in particular a central gate electrode. Electrode 26, 26B acts as a global, on-chip integrated gate in between the array of transistors 21. It ensures experimentally easy and homogeneous gating. Electrode 26, 26B is an external gate electrode (external to the GFETs). Electrode 26, 26B does not physically connect to GFETs 21. When, in use of the sensor 20, 200, a liquid sample is disposed on the sensor 20, 200, the liquid sample soaks the graphene channel and the gate electrode 26, 26B, establishing electrical contact between the graphene channel and the gate electrode 26, 26B. Therefore, gating is obtained through gate electrode 26, 26B when a liquid medium is in simultaneous contact with the graphene transistors 21 and with the gate electrode 26, 26B.

In a particular implementation, electrode 26, 26B is located at the center of the chip surface, in an area delimited by the two rows of transistors 21A, 21B. In other words, electrode 26, 26B is disposed between the two rows of transistors 21A, 21B. FIGS. 1A and 1B show preferred embodiments of electrodes 26, 26B. In sensor 20 (FIG. 1A), electrode 26 is partly located at the center of the chip, between the two rows of transistors 21A, 21B, but extends laterally (along the width of the chip), from a first end of the chip to the opposite end thereof. In sensor 200 (FIG. 1B), electrode 26B is partly located at the center of the chip, between the two rows of transistors 21A, 21B, but extends laterally (along the width of the chip), from a central area of the chip to an end thereof. In both sensors 20, 200, electrode 26, 26B preferably reaches at least one end (periphery) of the chip. Electrode 26, 26B is substantially parallel to the two rows of transistors 21A, 21B and to the two rows of source electrodes 22A, 22B. In a particular implementation, electrode 26, 26B deviates from the parallel rows of transistors 21A, 21B or parallel rows of source electrodes 22A, 22B, in an angle between 0 and 20° (degrees), such as between 0 and 15°, or between 2 and 15°, or between 5 and 15°. In an alternative implementation (not shown), electrode 26, 26B is made of a plurality of electrodes of smaller size, disposed substantially between the two rows of GFETs 21A, 21B. In sum, electrode 26, 26B may take any configuration provided it enables gating when a liquid medium is deposited on the sensor 20, 200, the liquid medium being in contact both with the GFETs and the electrode(s) 26, 26B.

Figure 1C:
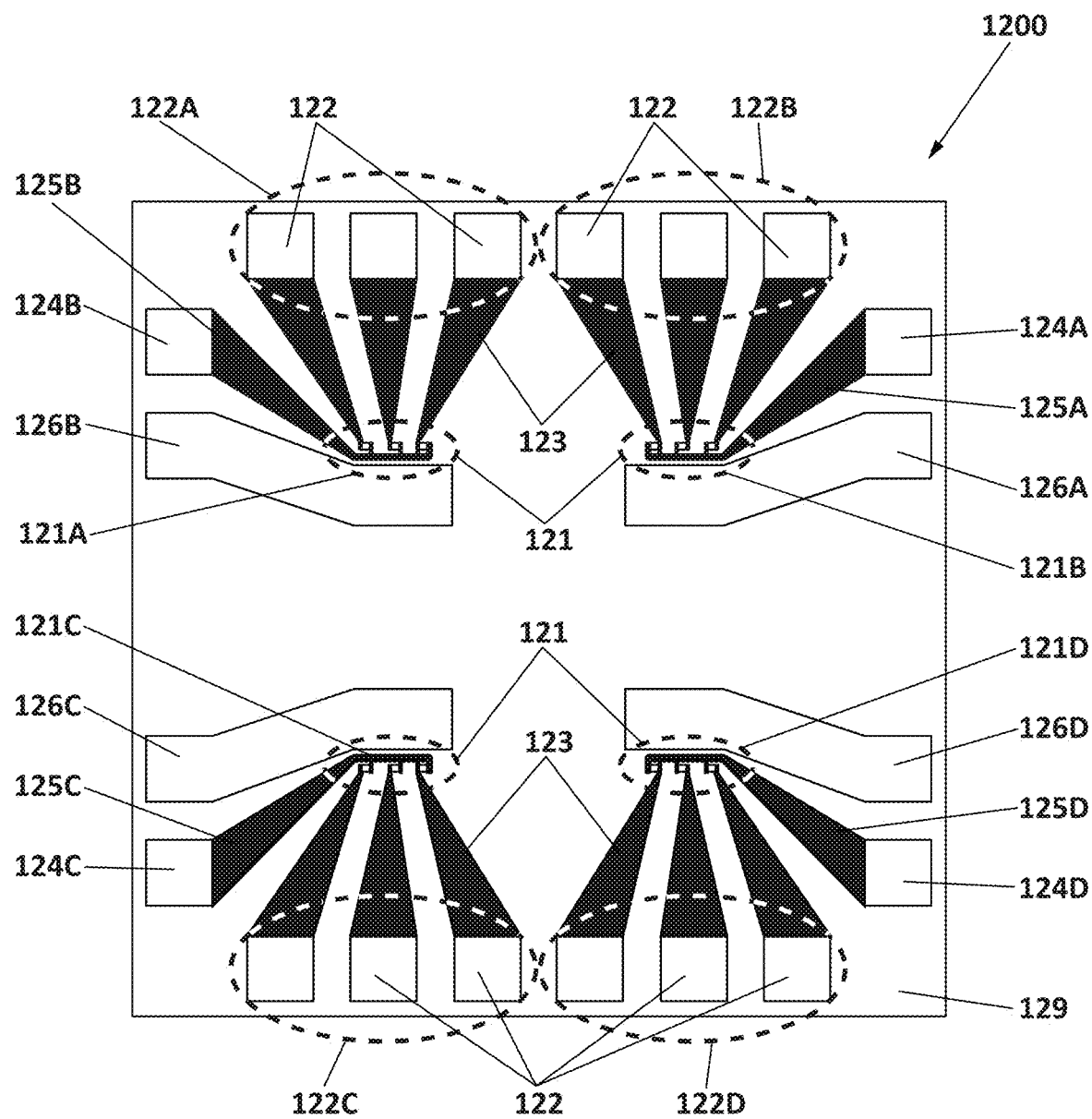

FIG. 1C shows another particular embodiment of a sensor 1200. In sensor 1200, there are also two rows of graphene transistors 121, but the transistors are grouped in four groups 121A-121D of three transistors per group. The four groups of transistors 121A-121D are located in a central area of the chip. Each group 121A-121D of graphene devices occupies a corresponding quadrant or quarter into which the substrate 129 is (virtually) divided. Two pairs of groups (121A-121B and 121C-121D) form a row; there is a gap free of transistors between each group in the row. Like in sensors 20, 200, sensor 1200 includes, in its periphery, a plurality of source electrodes 122 (also referred to as probe pads or contacts), each of which corresponding to the source electrode (source contact) of a corresponding GFET 121. Each source electrode 122 (122A, 122B, 122C, 122D for the respective groups of transistors) is connected to a corresponding GFET 121 through a metal track 123. Source electrodes 122 are disposed forming two parallel rows (first row 122A, 122B; second row 122C, 122D) of electrodes disposed at opposite sides at the periphery of the chip 1200. There are as many source electrodes 122 as graphene devices 121.

Sensor 1200 also includes, in its periphery, four drain electrodes 124A, 124B, 124C, 124D. A drain electrode is connected to the drain electrode (drain contact) of a GFET 121. A first drain electrode 124A acts as drain contact for all the graphene transistors of a first group 121A of transistors, a second drain electrode 124B acts as drain contact for all the graphene transistors of a second group 121B of transistors, a third drain electrode 124C acts as drain contact for all the graphene transistors of a third group 121C of transistors and a fourth drain electrode 124D acts as drain contact for all the graphene transistors of a fourth group 121D of transistors. Drain electrodes 124A-124D are preferably disposed at opposite sides of the chip 1200, at the periphery thereof, in particular at the sides thereof not occupied by the source electrodes 122A-122D. Each drain electrode 124A-124D is connected to the GFETs 121 of a corresponding group of GFETs 121A-121D, through a respective metal track 125A-125D, shared by all the transistors in the group. Metal tracks 123, 125A-125D are preferably encapsulated.

Sensor 1200 includes a non-encapsulated gate electrode, disposed at least in part at the center of the chip, which allows liquid gating without the need of an external gate electrode. In particular, sensor 1200 has four on-chip integrated gate electrodes 126A-126D. Like in sensors 20, 120, electrodes 126A-126D are external gate electrodes (external to the GFETs). Electrodes 126A-126D do not physically connect to GFETs 121. There is one gate electrode 126A-126D per group of GFETs 121A-121D. Each gate electrode 126A-126D is partly located at the center of the chip surface, in the vicinity of each corresponding group of transistors 121A-121D; and partly located at the periphery of the chip. In other words, electrodes 126A-126D extend substantially radially from the central area of the chip to its periphery. Each gate electrode 126A-126D is located in one of the four quadrants or quarters into which the substrate 129 is (virtually) divided. In a particular embodiment, not shown, the four gate electrodes 126A-126D may be connected forming a single physical electrode. For example, the four electrode ends disposed at the center of the chip may be connected to each other by prolonging the shown electrodes 126A-126D. In another particular embodiment, not shown, pairs of gate electrodes may be connected forming a single physical electrode. For example, the electrode ends of electrodes 126A-126B (and similarly, 126C-126D) located at the center of the chip may be prolonged until they form a single electrode. Or the electrode ends of electrodes 126B-126C (and similarly, 126A-126D) located at the periphery of the chip may be prolonged until they form a single electrode.

Figure 2:
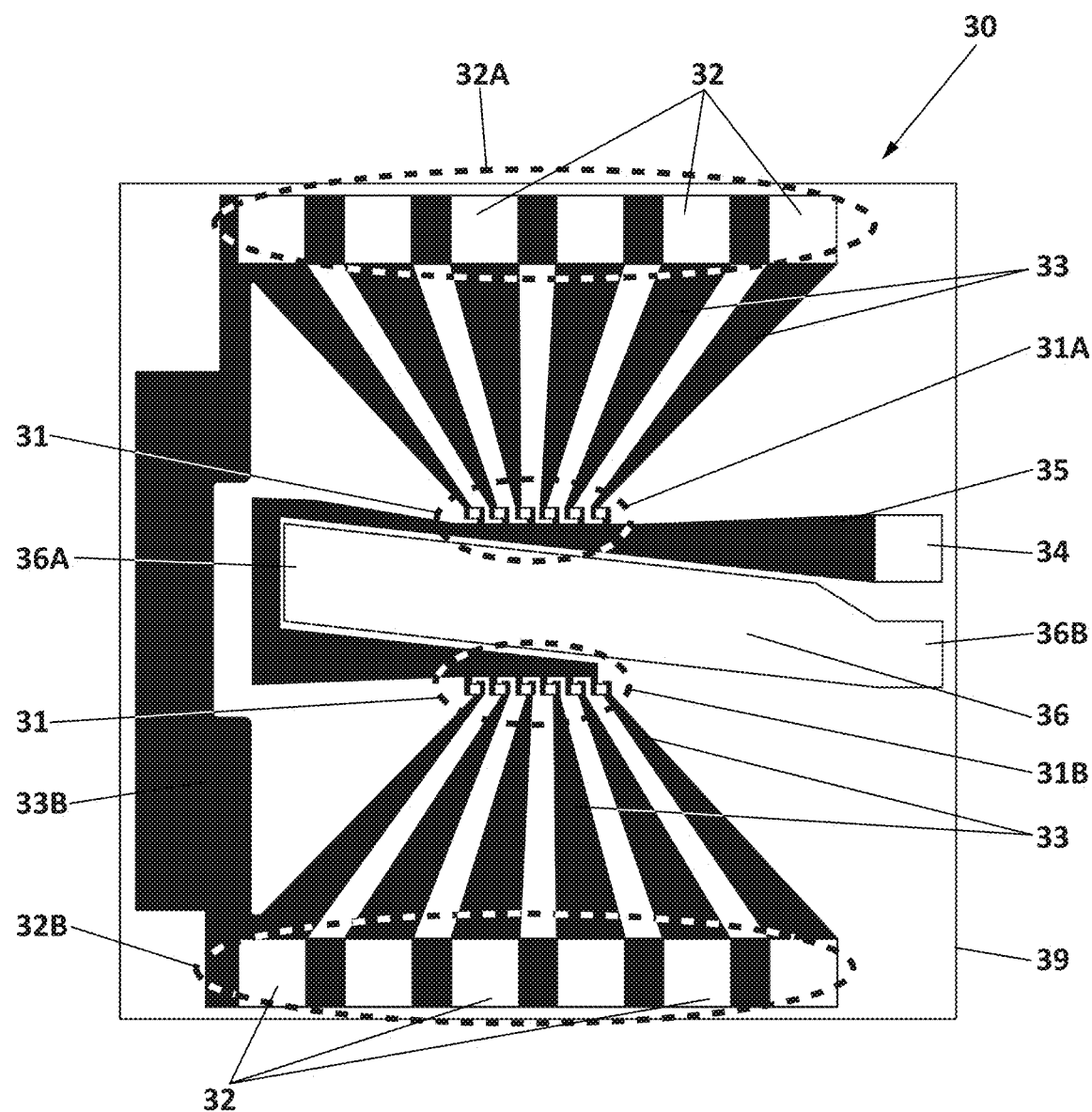
FIG. 2 illustrates a sensor comprising a plurality of GFETs, according to an alternative embodiment of the invention.

FIG. 2 illustrates an alternative embodiment of the sensor of the invention. The GFET sensor 30 shown in FIG. 2 is also made on a die of similar dimensions as the die on which sensor 20, 200, 1200 is made. In the absence of a particular description, the description of elements or components of sensor 20, 200, 1200 applies to corresponding elements or components in sensor 30. A similar substrate 39 as in sensor 20, 200, 1200 is used. Like in sensor 20, 200, 1200, sensor 30 also includes a plurality of graphene devices (graphene transistors, GFET) 31 located in a central area of the chip, forming two parallel rows 31A, 31B of graphene devices. Sensor 30 has a similar amount of graphene devices 31. In the implementation of FIG. 2, sensor 30 has 12 GFETs 31 disposed in two parallel rows of 6 GFET per row. However, unlike the GFETs in sensor 20, 200, 1200, the GFETs 31 in sensor 30 have a common source and common drain configuration, meaning that all the GFETs 31 (the 12 of them in FIG. 2) behave as a single device. This is implemented as follows.

Like sensor 20, 200, 1200, sensor 30 also has a plurality of contacts 32 (also referred to as probe pads or contacts), located in the periphery of the chip, but these contacts 32 are not independent from each other. Rather, they all correspond to a single source electrode (source contact) for all the GFET 31. Contacts 32 are made of metal (non-encapsulated metal), in a similar way as contacts 22 in sensor 20, 200, 1200. Like in sensor 20, 200, 1200, contacts 32 are disposed forming two parallel rows 32A, 32B of contacts disposed at opposite sides at the periphery of the chip. In the particular implementation in which there are 12 GFETs 31 disposed in two parallel rows, there are consequently 12 contacts 32 disposed in two parallel rows 32A, 32B of 6 contacts per row. However, while each non-encapsulated contact 32 is connected to a corresponding GFET 31 through a metal track 33, all metal tracks 33 are connected to each other through a continuous metal track 33B disposed along the periphery of the chip. In FIG. 2, the continuous metal track 33B continuously extends along a first row of contacts 32A, a lateral, peripheral side of the chip and a second row of contacts 32B, in a continuous way. Therefore, all graphene transistors 31 have a common source contact (source electrode). Metal tracks 33, 33B are encapsulated in order to avoid degradation and to reduce leakage currents, in a similar way as in sensor 20, 200, 1200. Contacts 32 (probe pads) are not encapsulated.

Regarding the drain electrode(s), while sensor 20 includes two drain electrodes 24A, 24B, and sensor 1200 includes four drain electrodes 124A-124D, sensor 30 has, like sensor 200, a single drain electrode or drain contact 34. This single drain electrode 34 acts as drain contact for all the graphene transistors 31. The drain contact 34 is preferably disposed at a peripheral location in the chip, in particular preferably at the side thereof not occupied by the metal track 33B connecting all source contacts 32A, 32B. Drain electrode 34 is connected to the GFETs 31 through a metal track 35. Metal track 35 is encapsulated in order to avoid degradation and to reduce leakage currents, in a similar way as in sensor 20. The description of the encapsulation of metal tracks 23, 123, 25A-25C, 125A-125D of sensor chip 20, 200, 1200 is applicable to metal tracks 33, 33B, 35 in sensor 30. Electrode 34 is not encapsulated.

Therefore, all the GFETs 31 in sensor 30 are connected in parallel, since they all share a common source and common drain. Therefore, all the GFETs 31 behave as a single device. This allows for truly experimental signal multiplexing.

Like sensor 20, 200, 1200, sensor 30 also includes a non-encapsulated electrode 36, disposed at least in part at the center of the chip surface. This electrode 36 allows liquid gating without the need of an external gate electrode. Therefore, electrode 36 is a gate electrode, such as a central gate electrode. Electrode 36 is made of metal. Electrode 36 is located at least in part at the center of the chip surface, in an area delimited by the two rows of transistors 31A, 31B. In a preferred implementation, electrode 36 is partly located at the center of the chip surface, between the two rows of transistors 31A, 31B, but extends laterally (along the width of the chip), from a location situated substantially between the periphery of the chip and the center thereof, to the periphery of the chip at the opposite end thereof. This can be seen more clearly in FIG. 2, wherein reference 36A represents a first end of electrode 36 (situated substantially between the periphery of the chip and the center thereof) and reference 36B represents a second end of electrode 36 (situated at the periphery of the chip, at an opposite side thereof). Like in sensor 20, 200, electrode 36 is substantially parallel to the two rows of transistors 31A, 31B and to the two rows of source contacts 32A, 32B. In a particular implementation, electrode 36 deviates from the parallel rows of transistors 31A, 31B or parallel rows of source contacts 32A, 32B, in an angle between 0 and 20° (degrees), such as between 0 and 15°, or between 2 and 15°, or between 5 and 15°. Since all the GFETs 31 (in two rows) need to be connected to the drain contact 34 through metal track 35, metal track 35 extends from drain contact 34, substantially in parallel to electrode 36 (therefore contacting all the GFETs in the first row 31A), surrounds electrode 36 at side 36A, and extends again parallel thereto until track 35 is connected to all transistors in the second row 31B.

Figure 6:
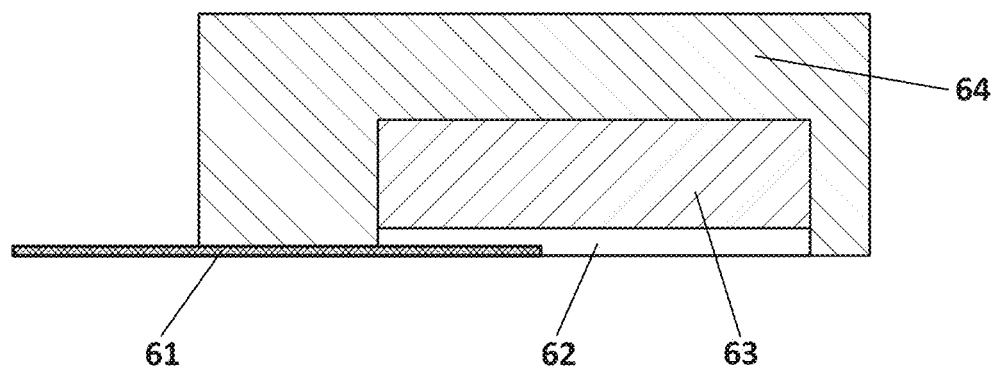
FIG. 6 schematically shows a side view of an exemplary electrode in contact with a graphene transistor (graphene layer), according to an embodiment of the invention.

Electrodes 22A-22B, 122A-122D, 32A-32B, 24A-24C, 124A-124D, 34, 26, 26B, 126A-126D, 36 are preferably made of metal. Non-limiting metals of which electrodes may be made, are: chromium (Cr), gold (Au), titanium (Ti), nickel (Ni), aluminium (Al), platinum (Pt), palladium (Pd), copper (Cu), permalloy (Py), cobalt (Co), tungsten (W), silver (Ag), tantalum (Ta) and combinations thereof. Electrodes may be made of different layers. For example, they may be made of a wetting layer 62 of a first metal and a contact layer 63 of a second metal, as shown for example in FIG. 6. As shown in FIG. 6, the wetting layer 62 is in contact with the graphene layer 61. On the wetting layer 62 the contact layer 63 is deposited. The stack formed by graphene layer 61, wetting layer 62 and contact layer 63 is covered with encapsulation 64, which also covers part of the graphene layer 61 on which no metal has been deposited. The thickness of the wetting layer may be of 1-10 nm. The thickness of the contact layer may be of 10-1000 nm. The wetting layer may be made of chromium (Cr), titanium (Ti), nickel (Ni) or combinations thereof. The contact layer may be made of gold (Au), polysilicon (poly-Si), aluminium (Al), platinum (Pt), palladium (Pd), copper (Cu), permalloy (Py), cobalt (Co), tungsten (W), manganese (Mn), silver (Ag), tantalum (Ta) or combinations thereof.

Figure 3A:
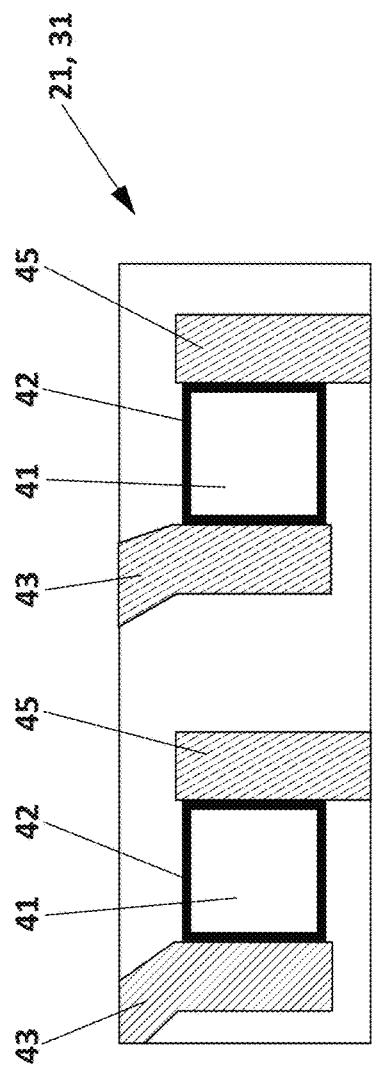
FIG. 3A shows a detailed view of two consecutive GFETs of the plurality of GFETS comprised in any of the sensors of FIGS. 1A-1C and 2.

FIG. 3A illustrates a detailed view of two consecutive GFETs of any of rows 21A, 21B, 31A, 31B or groups 121A-121D. Each GFET is represented as a squared portion of graphene. The inner area of each square 41 is non-encapsulated graphene, while its outer perimeter 42 is encapsulated graphene. In each illustrated GFET two portions of metal tracks 43, 45 can be seen: a first portion of encapsulated metal track 43 (23 in FIGS. 1A-1B, 123 in FIG. 1C, 33 in FIG. 2) connecting the source contact of the GFET with a corresponding source electrode 22A-22B, 122A-122D, 32A-32B; and a second portion of encapsulated metal track 45 (25A-25B in FIG. 1A, 25C in FIG. 1B, 125A-125D in FIG. 1C, 35 in FIG. 2) connecting the drain contact of the GFET with a drain electrode 24A-24C, 124A-124D, 34.

Figure 3B:
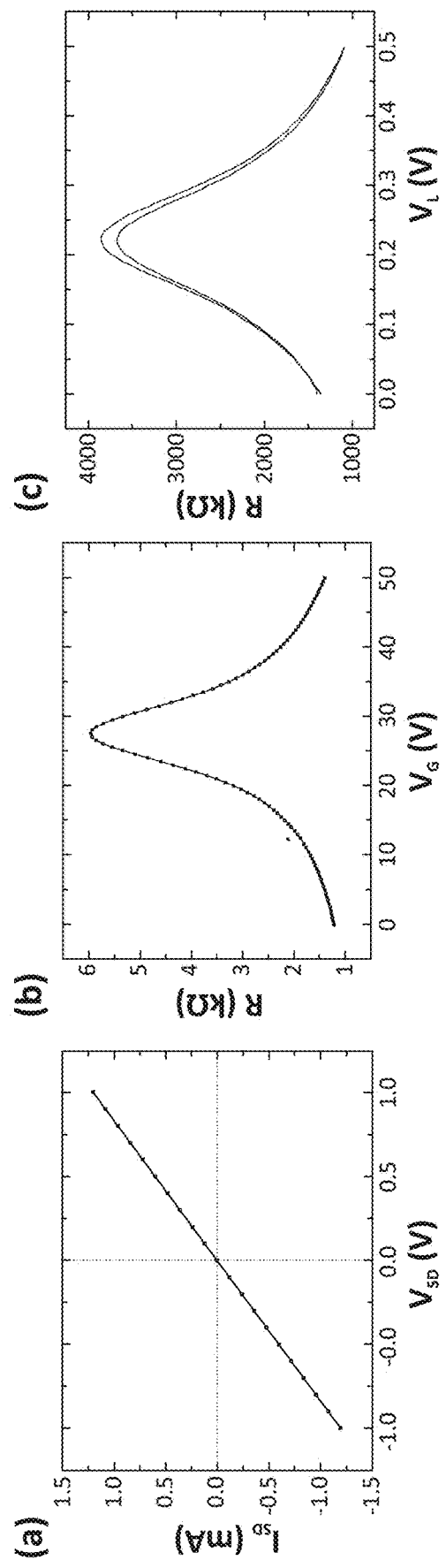
FIG. 3B shows transfer curves of an exemplary GFET as implemented in any of the sensors of FIGS. 1A-1C and 2.

FIG. 3B shows transfer curves of any one of the GFETs 21, 121 implemented in a sensor. First curve on the left refers to the output current $I_{SD}$ (mA) versus output voltage $V_{SD}$ (V), measured at room temperature and vacuum conditions. It shows the change in the source-drain current flowing through the graphene channel, as a consequence of the change in conductance due to the source-drain voltage applied, for a typical GFET sensor chip. Second curve at the center represents the transfer curve, under back-gating conditions through the doped-Si substrate, measured at source-drain voltage of 20 mV, under same conditions as the first curve. Third curve on the right shows the transfer curve, under liquid gating through Phosphate Buffered Saline (PBS, pH=7.3), using the on-chip electrode as gate electrode.

Figure 4A:
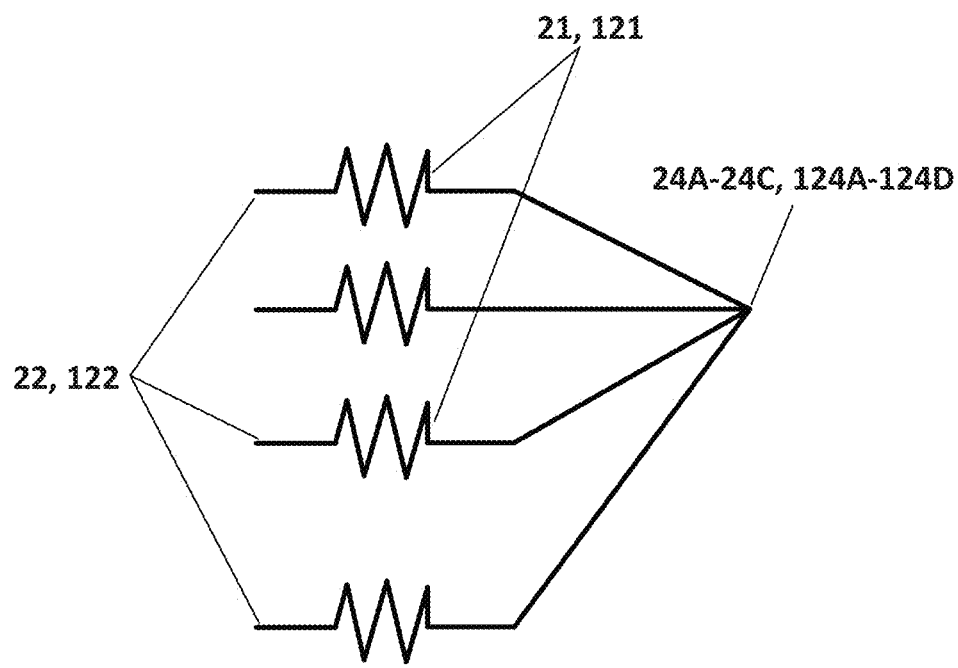
FIG. 4A schematically shows the equivalent circuit of the graphene transistors (GFET) comprised in the sensor of FIGS. 1A-1C.
Figure 4B:
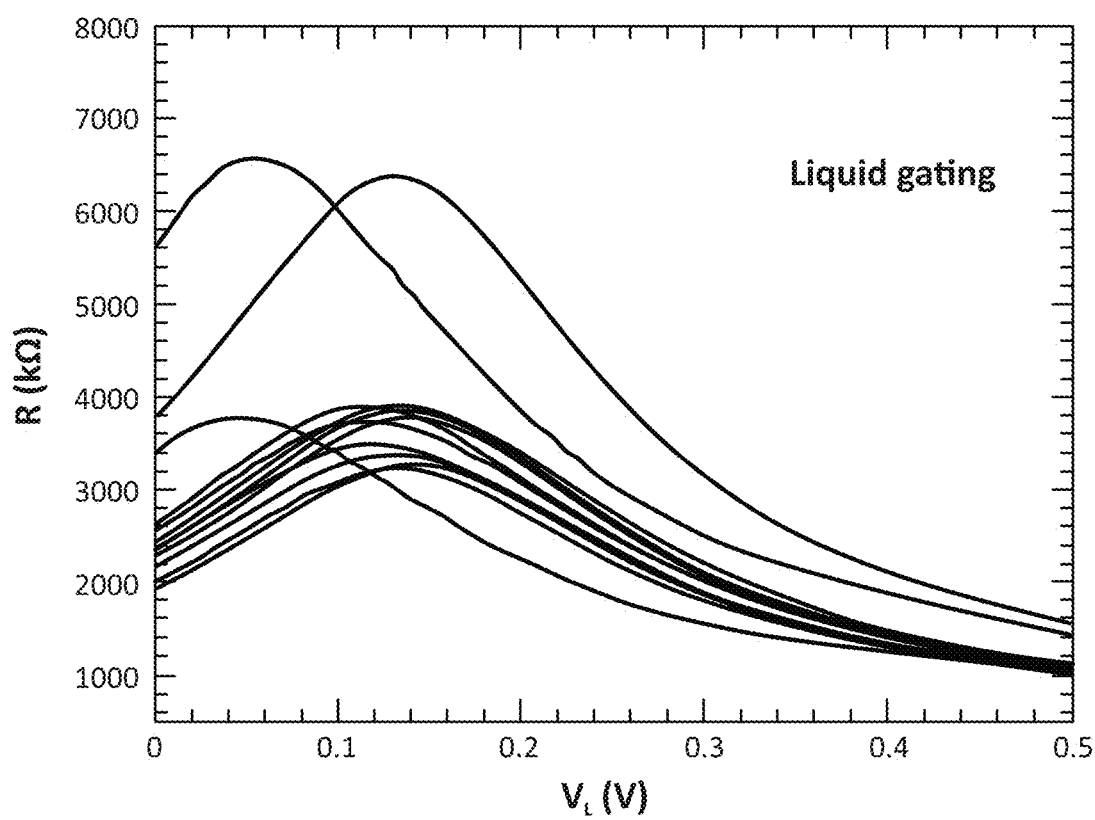
FIG. 4B shows the transfer curve obtained for liquid gating with the GFETs comprised in the sensor of FIGS. 1A-1C.
Figure 5A:
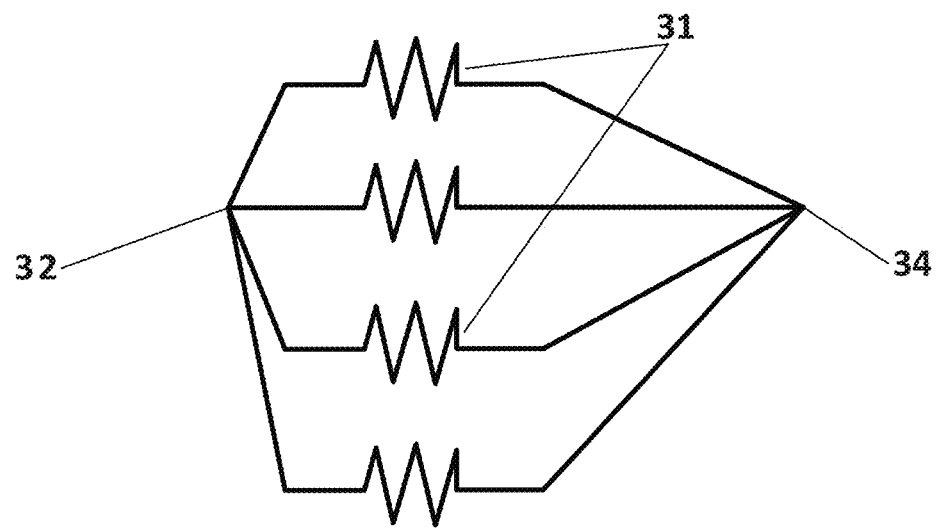
FIG. 5A schematically shows the equivalent circuit of the graphene transistors (GFET) comprised in the sensor of FIG. 2.

FIGS. 4A and 5A schematically show the equivalent circuits of the graphene transistors (GFETs) of sensors 20, 200, 1200 and 30, respectively. In FIG. 4A, each transistor 21, 121 of sensor 20, 200, 1200 has an independent source pad 22A, 22B, 122A-122D, while all the transistors in a same row 21A, 21B or group 121A-121D share a common drain 24A, 24B, 124A-124D (or all the transistors 21A-21B in sensor 200 share a common drain 24C). As a consequence, although it can be considered that all the transistors 21, 121 in sensor 20, 200, 1200 behave in a multiplexed way, signal post-processing is needed (for example using noise removal algorithms, or inference via machine learning and/or artificial intelligence algorithms), including more complex readout/electronics (for example, one readout device per transistor). Post-processing is needed to extract and remove parasitic signals that might worsen the signal-to-noise ratio of the device and thus worsen its sensitivity and specificity, as well as improving device-to-device performance and statistics that strengthen reliability. Post-processing is out of the scope of the present invention. FIG. 4B represents the change in the source-drain current flowing through the graphene channel, as a consequence of the change in conductance due to the gate voltage applied, for a typical GFET sensor 20, 200, 1200.

Figure 5B:
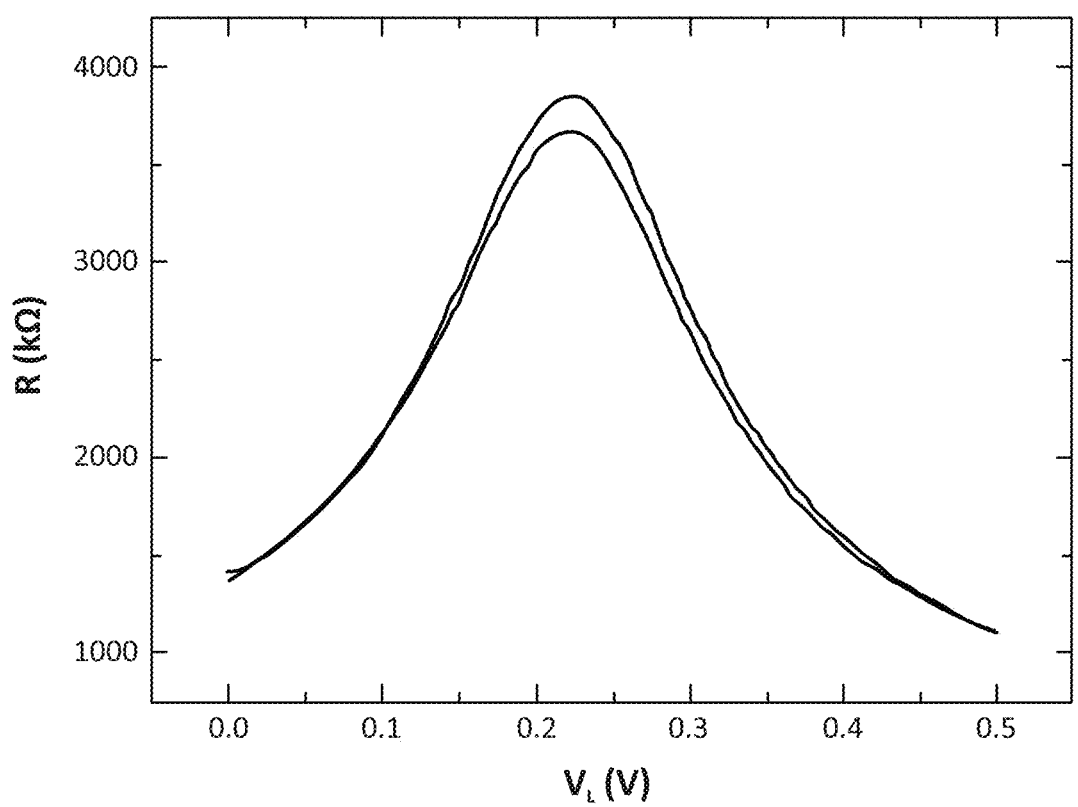
FIG. 5B shows the transfer curve obtained for liquid gating with the GFETs comprised in the sensor of FIG. 2.

On the contrary, in FIG. 5A, all the transistors 31 of sensor 30 share a common source 32 and a common drain 34. As a consequence, all the transistors in the sensor 30 truly behave as a single one (proper multiplexing) and no post-processing is required as the electrical output is a single signal, which implies that simpler readout/electronics is possible (for example, one effective readout device suffices). The configuration in FIG. 2 (or FIG. 5A) may need slightly more power (S/D bias voltage), but within the reasonable requirements for low-power sensing. FIG. 5B represents the change in the source-drain current flowing through the graphene channel, as a consequence of the change in conductance due to the gate voltage applied, for a typical GFET sensor 30. There are two curves due to hysteretic behaviour when the gate voltage is swept up (0-0.5V) and down (0.5-0V).

The encapsulation layer (shown for example in FIG. 6) produces an additional advantage, since it reduces the leakage current as well as parasitic signals that might come from electrochemical interactions/reactions triggered between the liquid sample and the metal electrodes, such as electrolysis. This effectively increases signal-to-noise ratio and improves the sensor sensibility.

Sensor 20, 200, 1200, 30 enables electrical readout of the output signal, with respect to chromatographic or optical schemes. The output data can potentially be used to feed a neural network or an artificial intelligence algorithm, capable of further enhancing the statistical analysis of the data.

The proposed configurations have the following advantages: (1) The integrated on-chip gate electrode allows for improved and homogeneous electrical control. Furthermore, the on-chip electrode also eases the integration of the GFETs into sensoric and electronic devices as they do not need an external gate probe. (2) The encapsulated electrodes ensure that there are not parasitical signals from the interaction between the analyte and the electrodes, such as hydrolysis or electrochemical redox reactions. This improves the signal-to-noise ratio of the output signal. (3) The pads in the periphery also ensure that there are not parasitical signals from the interaction between the analyte and the pads, such as hydrolysis or electrochemical redox reactions. This improves the signal-to-noise ratio of the output signal. (4) The reduced footprint on which the GFETs are manufactured conform a reduced interaction area, which ensure a homogeneous and continuous interaction with both the analyte and the gate electrode. This improves the electrostatic control and the sensitivity. (5) The device design can naturally be scaled up or down to satisfy any form factor required without any changes in performance or layout.

Next, a manufacturing method of a sensor 20, 200, 1200, 30 as illustrated in FIGS. 1A-1C and 2 is described following possible embodiments of the invention.

Sensor 20, 200, 1200, 30 is fabricated using advanced semiconductor fabrication techniques. Steps of a manufacturing process of a sensor are shown in FIGS. 7A-7D. The same manufacturing steps, applied to a particular GFET, are shown in FIGS. 8A-8H.

Figure 7A:
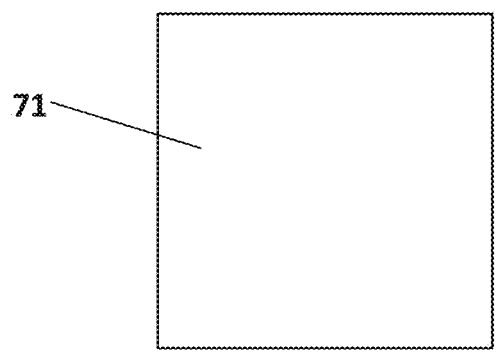
FIGS. 7A-7D schematically represent the manufacturing process of a wafer comprising a plurality of sensors as disclosed in the embodiments of FIGS. 1A-1C and 2.

In FIGS. 7A-7D, different layers are deposited on a SiO$_2$/Si wafer. The wafer may have different dimensions, for example ranging from 50 mm to 1,000 mm diameter, such as diameters of 100 mm, 150 mm, 200 mm or 300 mm. First, a graphene layer 71 is deposited on the SiO$_2$/Si wafer. FIG. 7A shows a top view of the graphene layer 71 on the wafer. In FIGS. 8A-8B (top view and side view, respectively), a portion of graphene layer 81, corresponding to a GFET, deposited on a corresponding portion of the SiO$_2$/Si wafer 80, is shown. This structure (graphene on SiO$_2$/Si) is coated with a photoresist. The photoresist is preferably a photosensitive polymer which undergoes monomerization, for example upon UV exposure, which in turns changes its molecular weight and structure.

Figure 7B:
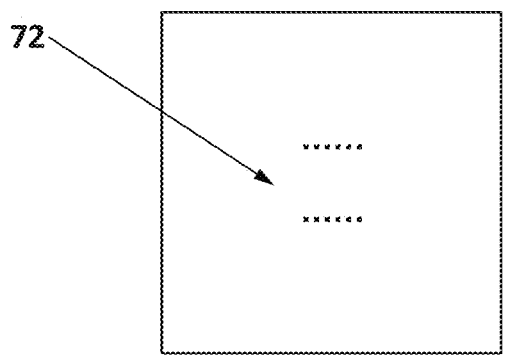

In a first lithographic step, shown in FIG. 7B, the graphene wafer coated with photoresist is exposed to UV light through a stencil mask that contains the pattern of the graphene channels of the GFETs (in other words, the pattern with the desired location of the graphene transistors 21, 121, 31 in the sensor 20, 200, 1200, 30) and immersed in a developing solution, such as tri-methylaluminium hydroxide (TMAH). This developing solution only dissolves the exposed polymer which has a lower molecular weight, replicating the pattern of the stencil mask on the photoresist, creating a patterned structure. In the top view of FIG. 7B, the graphene pattern 72 is represented as two rows of dots, the dots representing the graphene devices. In FIGS. 8C-8D (top view and side view, respectively), one graphene channel 82 corresponding to one GFET obtained after this first lithographic step, is shown. The photoresist protects the graphene underneath from the process of etching, such as plasma etching or reactive ion etching. The subsequent etching step creates a radiofrequency plasma, which bombards the substrate and removes the graphene material exposed to the plasma or reactive ion, transferring the stencil mask image to the graphene layer. This effectively creates the graphene channels onto the wafer substrate (or one graphene channel 82, as shown in FIGS. 8C-8D). In sum, after the first lithographic step, the graphene channels 72, 82 as defined in the stencil mask, covered with the photoresist, are obtained on the substrate. The structure undergoes a cleaning step with a solvent to dissolve and remove the photoresist and prepare the wafer for a second lithographic step.

Figure 7C:
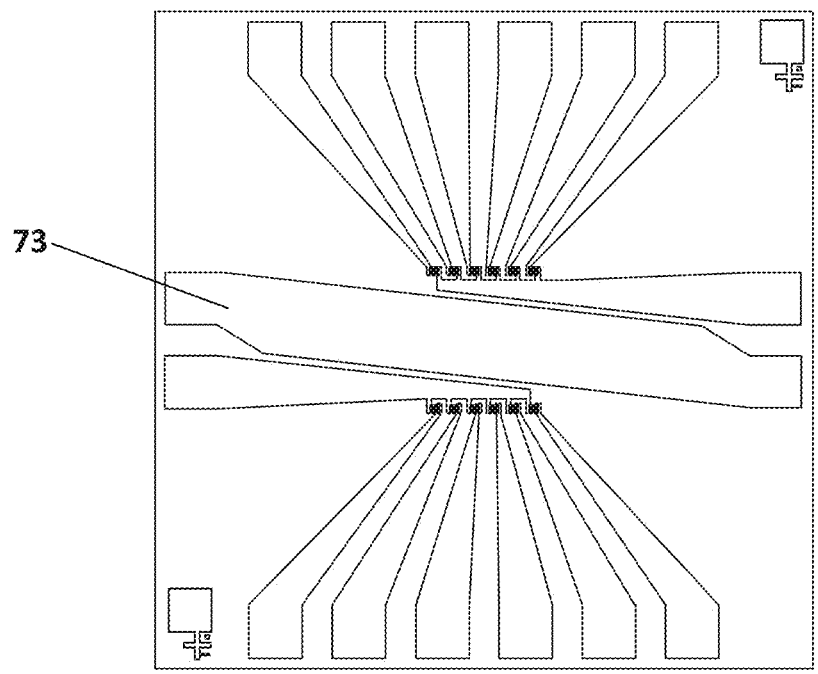

In a second lithographic step, the assembly is again coated with a photoresist, and a metal contact pattern is exposed through a different mask, and developed. The assembly therefore undergoes metallisation, which can be via sputtering, thermal evaporation and/or e-beam evaporation, in which a thin-film of metals (5-5000 nm) 73 is deposited. The sample is then inserted in a photoresist stripper, which dissolves the photoresist and lifts-off the metal from the unexposed parts, which still contain photoresist. The result of the second lithographic step is illustrated in FIGS. 7C and 8E-8F. In FIG. 7C, the resulting metal tracks 73 are shown. In FIGS. 8E-8F (top and side views, respectively), it can be seen that the resulting metal tracks 83 contact the graphene channel (GFET) 82, in particular its source and drain. As can be seen, FIG. 8E corresponds to one of the GFETs of FIG. 3A.

Figure 7D:
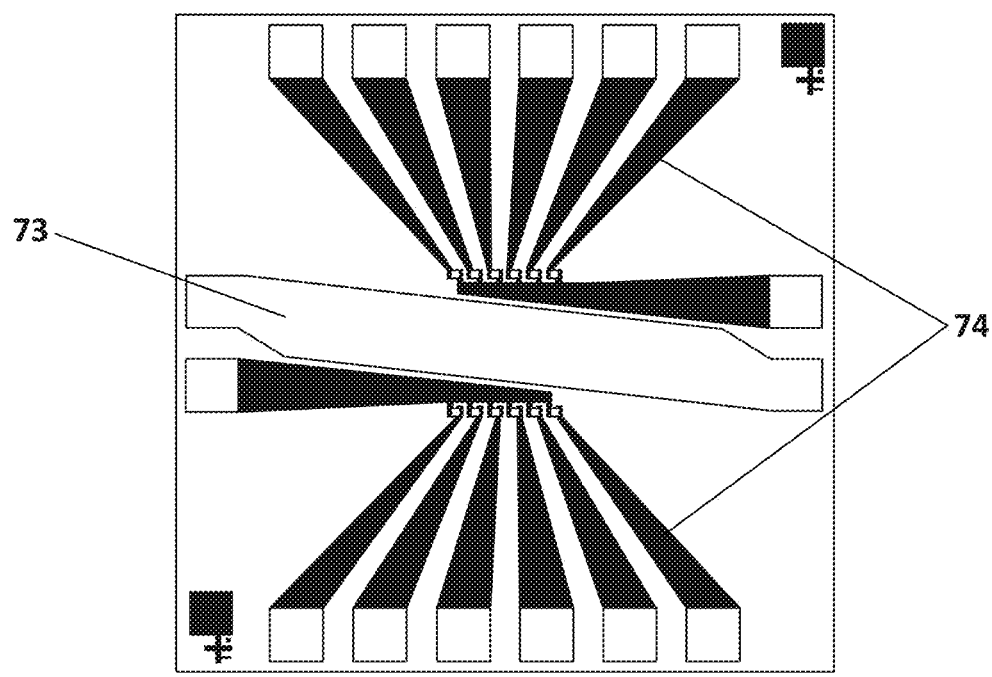
Figure 8G:
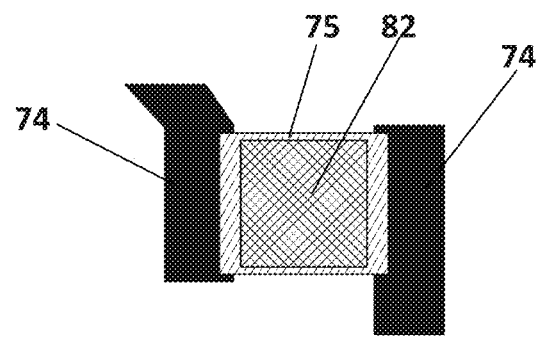
Figure 8F:
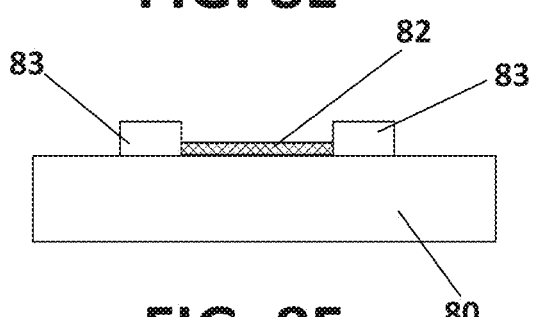
Figure 8H:
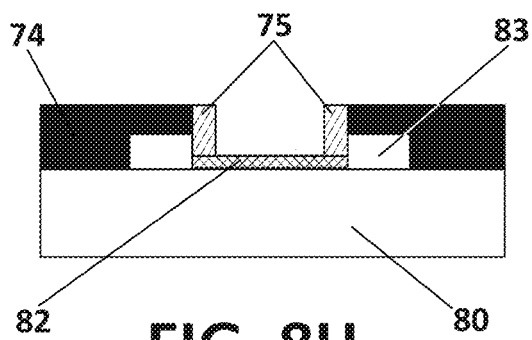

In a third lithographic step, shown in FIGS. 7D and 8G-8H, an encapsulation layer 74, 75 is deposited (polymeric or ALD) on the structure, and the assembly is coated with photoresist again, exposed and developed to open vias (opening or windows) in the encapsulation (by removing a portion of encapsulation) in order to reach the graphene channel or the metal tracks, as the case may be. This may be done with a selective chemical etchant solution that dissolves the encapsulation layer only in the places where the photoresist has been removed, but does not dissolve the un-exposed photoresist that remains. For example, but not limiting, the chemical etchant may be TMAH, sodium hydroxide (NaOH), hydrofluoric acid (HF), hydrochloric acid (HCl), phosphoric acid (H$_3$PO$_4$) or combinations thereof. Once the encapsulation layer has been dissolved where it must be dissolved and the graphene channel and metal pads are consequently exposed, the assembly is preferably immersed in photoresist stripper to remove the remaining photoresist and clean the wafer. The assembly is preferably coated again with photoresist for protection prior to dicing. In FIG. 7D, the resulting encapsulation 74 on metal tracks is shown. In FIGS. 8G-8H (top and side views, respectively), it can be seen the non-encapsulated graphene 82 and the applied encapsulation 74, 75 (in FIG. 8H, reference 74 refers to the encapsulation applied to the metal contacts 83 and to the substrate 80; and reference 75 refers to the encapsulation applied to a portion of the graphene). The assembly is then diced using an automatic dicing saw. After dicing is carried out, the diced chips (sensors) may be immersed in photoresist stripper to remove the photoresist and clean the surface. FIGS. 1A-1B and 2 show exemplary diced chips or sensors thus obtained.

The sensor 20, 200, 1200, 30 thus manufactured therefore provides a multiplexed array of transistors in a reduced footprint. Its configuration allows for a single droplet—such as several microliters (μm, 10$^{-6}$ liters)—to impregnate all the GFETs simultaneously. The disposal of the contact pads (source pads 22, 122, 32 and drain pads 24A-24C, 124A-124D, 34) in the periphery of the chip ensures no shorting with the liquid sample.

In use of the sensor 20, 200, 1200, 30, when a sample in liquid state—such as blood or saliva—is deposited on the sensor 20, 200, 1200, 30, in particular on the gate electrode 26, 26B, 126A-126D, 36, in such a way that the sample becomes in contact with the transistors 21, 121, 31 and with the gate electrode 26, 26B, 126A-126D, 36, the sample allows for liquid gating. In other words, measurement connectors (external to the sensor 20, 200, 30, not shown) may couple to the sensor pads 22, 32, 122, 24A-24C, 124A-124D, 34, 26, 26B, 126A-126D, 36 to measure current when the transistors 21, 121, 31 are exposed to a liquid sample.

In order for the sensor 20, 200, 1200, 30 to sense perturbations at its surface, and in particular to gain a required sensitivity depending on the application, graphene is preferably functionalized with a selected substance, such as molecules or bioconjugates, that creates specific binding sites for biomarkers of choice to be bonded to. In other words, the surface of the GFETs needs to be functionalised with an appropriate linker molecule and probe molecule (or only with a probe molecule). A probe molecule to be coupled to a linker molecule has specificity for a certain biomarker. The biomarker may be a protein, an enzyme, an antibody, a virus, an antigen, a pathogen or a volatile organic compound, among others. The probe molecule is selected for its bonding properties with specific biomarkers, such as antibodies or compounds. After the probe molecule is attached to the linker molecule, the graphene surface is cleaned in a buffer solution. Passivation may be applied in order to passivate the graphene surface not attached to the linker. This enhances the sensitivity and specificity of the sensor. When the biomarker of choice interacts with the probe molecule, they bind, producing a change in the electronic state of the probe and linker molecule. This produces a charge transfer into the graphene channel which changes its conductivity. This results in a change in the conductance of graphene and thus a change in the current flowing through the transistor, which is the output signal.

Therefore, in embodiments of the invention, a linker molecule is firstly attached to the surface of the GFETs. Secondly, a probe molecule is attached to the linker molecule. Probe molecules are associated to a target substance or biomarker, which is the object/molecule to be detected. Non-limiting examples of probe molecules are an antibody, an enzyme, an antigen, a virus, a protein, a pathogen, an aptamer, a phenyl acid, a peptide aptamer, an amine, an aminoacid and a glycoprotein, among others. The linker molecule may be an organic molecule containing aromatic molecules having a non-covalent link to the graphene or an organic molecule having a covalent link to the graphene. The linker has a functional group for anchoring or attaching the probe molecule. Suitable functional groups include amino, thiol, activated esters, carboxy, etc. Specially interesting are activated esters such as N-hydroxysuccinimide esters for the modification of amino groups present in proteins, antibodies, viruses, etc. Non-limiting examples of passivation molecules are polymers, biopolymers, epoxides and alcohols such as polyethyleneglycol (PEG), amino-PEG-alcohol, polyethylene teraphtalate, polyethylene napthalate, bovine serum albumin (BSA), casein and ethanolamine hydrochloride. Passivation molecules bind to the graphene surface that is free of linker sites. These molecules passivate the linker site, saturating the dangling bonds and making it unreactive to the analyte, increasing sensitivity and specificity.

Thus, when a specific biomarker bonds with a specific antibody, conductive properties of the graphene change, causing the transistors to switch on and allowing current to flow to the transistors' source (and therefore to a measurement connector connected to the source electrode). In other words, the sensor 20, 200, 30 detects a change in the superficial charge, which induces changes in the conductivity of the graphene transistors, which act as the sensing element/transducer. Graphene transistors implemented on a sensor 20, 200, 1200, 30 may be functionalized with a uniform probe molecule designed to bond with a biomarker. Alternatively, multiple probes may be used for the different graphene transistors, such that a single chip may detect multiple biomarkers present in a single liquid sample. In sum, any antibody known to bond to a particular biomarker may be used in the sensor 20, 200, 1200, 30 to detect the presence of that biomarker.

The linker molecule attached to the surface of the GFETs may be attached by a non-covalent link. The linker molecule attached to the surface of the GFETs may be an organic molecule containing aromatic groups, such as a polycyclic aromatic hydrocarbon (PAH), attached to a functional molecule from a functional group. The PAH may be a molecule of the family of the naphtalenes, anthracene, phenanthrene, phenalene, tetracene, chrysene, triphenylene, pyrene, pentacene, perylene, benzo[a]pyrene, benzo[chi]pyrene, coronene and ovalene. The linker molecule binds to the graphene surface, undergoing immobilization. The linker creates active sites for the probe molecule of choice, which replaces the functional group. In use of the sensor, when a liquid sample is deposited on the sensor, a probe molecule is attached to the linker molecule. The probe molecule breaks the link between the PAH and its functional group, substituting and taking the place of the functional molecule which is removed, and thus being immobilized on top of the graphene field effect transistor.

For example, a naphthalene aromatic molecule may be used, such as 1-8 bis(bromomethyl)naphthalene. In another example, a molecule of the aromatic family of the anthracenes may be used, such as 9-(methylaminomethyl) anthracene and 7,12-dymethylbenz[a]anthracene. In another example, a molecule of the aromatic family of the phenanthrenes, such as 5-nitro-1,10-phenanthroline, 9-phenanthrenecarboxaldehyde, is used. In another example, a molecule of the aromatic family of the pentacenes, such as 6,13-pentacenequinone and pentacene-N-sulfinyl-tert-butylcarbamate, is used. In another example, a molecule of the aromatic family of the perylenes, such as N—N'-dimethyl-3,4,9,10-perylenedicarboximide, perylene-3,4,9,10-tetracarboxylic dianhydride and 2,9-Dimethyl-anthra[2,1,9-def:6,5,10-d'e'f']diisoquinoline-1,3,8,10(2H,9H)-tetrone, is used. In another example, a molecule of the aromatic family of the pyrenes, such as 1-pyrenebutyric acid N-hydroxysuccinimide ester. 1-pyrenebutyruc acid, 1-pyreneacetic acid, 1-pyrenecarboxylic acid, 1-pyrenebutanoic acid, 1-pyrenemethylamine hydrochloride, 1-pyrenebutanol, 1-pyrenebutyric hydrazide, is used. In another example, a molecule of the aromatic family of the amines, 1-aminoanthracene, 2-aminoanthracene, 1-aminopyrene, 9-aminophenanthracene, 1-naphtylamine, 6-aminochrysene, is used. The selected molecule bonds to the graphene surface via π-π stacking, immobilizing the molecule. Alternatively, the molecule may be adsorbed in the graphene channel via van der Waals forces or hydrogen bonding, immobilizing the molecule. Alternatively, polycyclic aromatic molecules are assembled at the end of the linker molecule, and the linker molecules are adsorbed on the graphene by the affinity between the polycyclic molecules and graphene, immobilizing the molecule.

Alternatively, the linker molecule attached to the surface of the GFETs may be attached by a covalent link. Graphene surfaces can be covalently functionalised via radical reactions, cycloadditions or single atom introductions among others. In radical reactions, the addition of aryl radicals generated from the reduction of diazonium salts attacks the $sp^2$-hybridised graphene forming new $C(sp^3)$-aryl bonds. Examples of aryl diazonium salts include 4-nitro diazonium, 4-bromophenyl diazonium, 4-methoxyphenyl diazonium, 4-carboxyphenyl diazonium tetrafluoroborate. Subsequently, the chemical group that is attached to the phenyl ring in the 4 position can be used for anchoring the probe molecule. In addition to the diazonium salt chemistry, an alternative phenyl radical addition method is the photochemical approach, using benzoyl peroxide as phenyl radical precursor under laser illumination. Another way of generating phenyl radicals is the electrochemical decomposition of aryl iodonium salts or the electrochemical oxidation of carboxylate groups. Cycloaddition reactions can be performed by Diels Alder reactions while the introduction of single atoms including hydrogen, fluorine, chlorine and oxygen can be undertaken by liquid or plasma based processes.

Different sensors according to the invention have been manufactured. One is detailed next. A sensor following the embodiment of FIG. 1A has been manufactured. The sensor has the following characteristics: chip dimensions (die size): 10 mm×10 mm; chip thickness: 675 μm; number of GFETs per chip: 12; width (length) of square drain (or source)

electrodes 22A, 22B, 24A, 24B: 780 µm; separation between drain (or source) electrode 22A, 22B, 24A, 24B and chip perimeter: 155 µm; thickness of upper layer of substrate: 90 nm; material of upper layer of substrate: $SiO_2$; resistivity of substrate: 1-10 Ω-cm.

Figure 9:
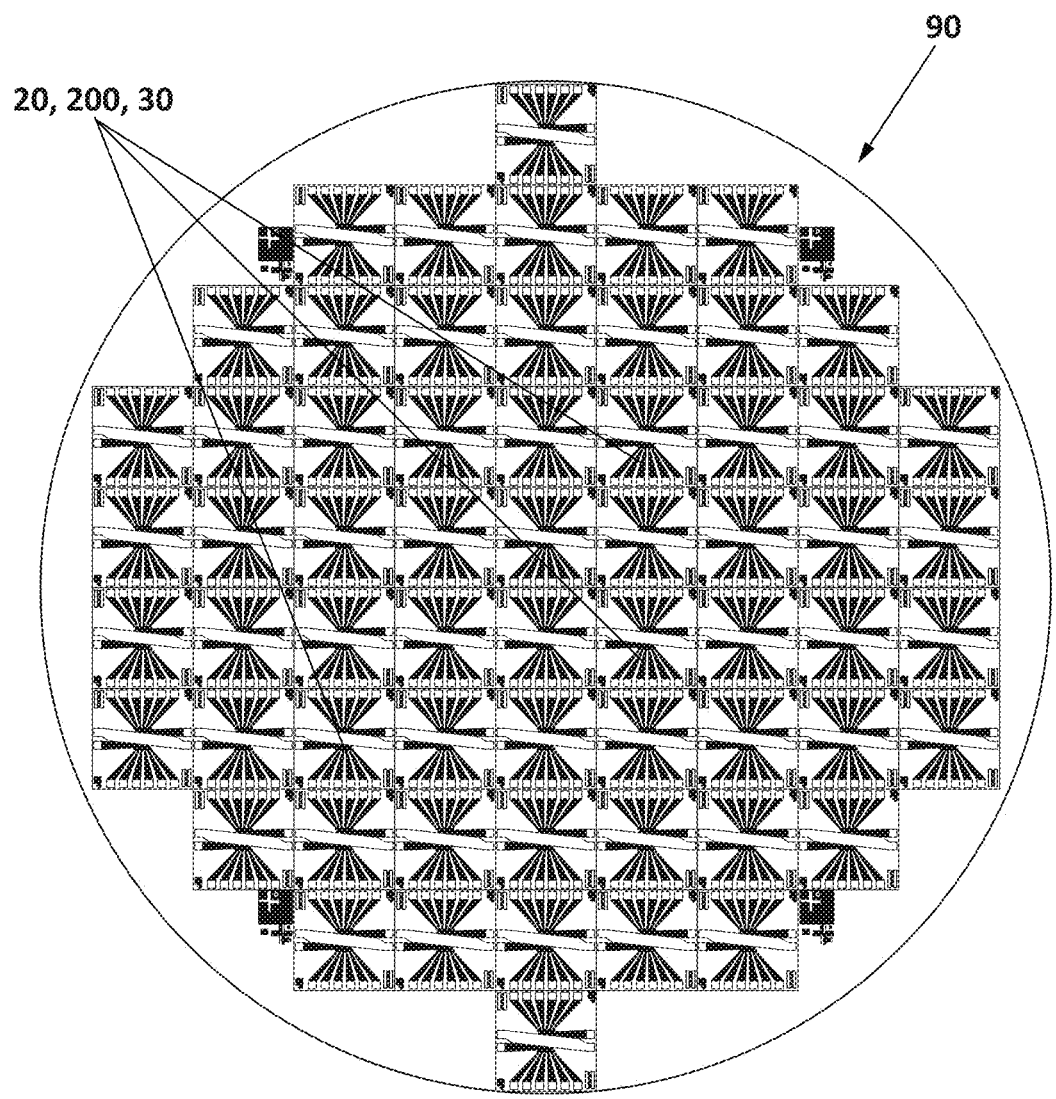
FIG. 9 illustrates a wafer comprising a plurality of sensors as disclosed in the embodiments of FIGS. 1A-1C and 2.

Sensors 20, 200, 1200, 30 have been manufactured in wafers of different dimensions, such as of 100 mm, 150 mm, 200 mm and 300 mm in diameter. This enables to include a plurality of chips (sensors) per wafer, such as between 20 and 20,000 chips per wafer. In a particular embodiment, a wafer of 100 mm diameter comprises 65 sensors 20, 200, 1200, 30. FIG. 9 shows an example of such a wafer 90, in which 65 integrated sensors 20, 200, 1200, 30 can be seen. When each sensor is designed to comprise 12 GFETs, the wafer includes 780 GFETs. This enables to increase the measurement throughput of the readout scheme dramatically, since it permits parallel sampling of 65 different analytes with signals coming from 780 GFETs, enabling statistical batch data acquisition and processing for an accurate diagnostic in the order of seconds. In sum, the sensor and wafer of the invention can resolve analytes down to fM/ml (femtoMoles per milliliter) with excellent selectivity and simple electrical readout, enabling ultra-fast diagnosis (<1 s).

In this text, the term "comprises" and its derivations (such as "comprising", etc.) should not be understood in an excluding sense, that is, these terms should not be interpreted as excluding the possibility that what is described and defined may include further elements, steps, etc.

In the context of the present invention, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

The invention is obviously not limited to the specific embodiment(s) described herein, but also encompasses any variations that may be considered by any person skilled in the art (for example, as regards the choice of materials, dimensions, components, configuration, etc., within the general scope of the invention as defined in the claims.

The invention claimed is:

1. A sensor comprising:
    a substrate;
    a plurality of graphene field-effect transistors (GFETs) deposited on the substrate, wherein the GFETs are disposed forming a first row and a second row of GFETs;
    at least one source electrode connected to the GFETs through at least one first metal track, wherein the at least one source electrode is disposed at a periphery of the substrate;
    at least one drain electrode connected to the GFETs through at least one second metal track, wherein the at least one drain electrode is disposed at a periphery of the substrate; and
    at least one gate electrode disposed on the substrate, wherein the at least one gate electrode is shared by at least some of the plurality of GFETs and the at least one gate electrode is disposed between the first row and the second row of GFETs,
    the sensor being configured to, when a sample is deposited in contact with the gate electrode and the GFETs, cause the sample to allow liquid gating between the gate electrode and the GFETs.

2. The sensor of claim 1, wherein the substrate is made of at least one of silicon, silicon oxide, glass, quartz or polymeric material.

3. The sensor of claim 1, wherein the at least one first metal track and the at least one second metal track are encapsulated.

4. The sensor of claim 3, wherein the encapsulation comprises at least one of alumina and titanium oxide.

5. The sensor of claim 1, comprising two drain electrodes, wherein a first drain electrode is connected to all the GFETs of the first row of GFETs, and a second drain electrode is connected to all the GFETs of the second row of GFETs.

6. The sensor of claim 1, comprising one drain electrode connected to all the GFETs of the first row of GFETs and of the second row of GFETs.

7. The sensor of claim 1, wherein the GFETs are disposed forming four groups of GFETs in a corresponding quadrant or quarter of the substrate; and there are four gate electrodes, each of them being partly located at the center of the substrate, in the vicinity of each corresponding group of GFETs; and partly located at the periphery of the substrate.

8. The sensor of claim 1, comprising a plurality of source electrodes, wherein each source electrode is connected to a respective GFET of the plurality of GFETs, through a respective first metal track, in such a way that each GFET has an independent source contact.

9. The sensor of claim 8, wherein the plurality of source electrodes is disposed forming two rows of source electrodes, the first row being disposed at a first end of the substrate and the second row being disposed at a second end of the substrate, opposite to the first end thereof.

10. The sensor of claim 1, comprising a plurality of source contacts, wherein all the source contacts of said plurality of source contacts are electrically connected to each other through a metal track, in such a way that all the GFETs share a common source.

11. The sensor of claim 10, comprising a single drain electrode connected to all the GFETs of the plurality of GFETs, in such a way that all the GFETs share a common drain.

12. The sensor of claim 1, wherein the at least one gate electrode is not in physical contact with the GFETs.

13. The sensor of claim 1, further comprising at least one probe molecule bonded to the GFETs, the sensor being configured to, if the at least one probe molecule is exposed to a biological sample comprising a biomarker while voltage is applied to the GFETs, cause the conductance of the GFETs to change.

14. A wafer comprising a plurality of sensors according to claim 1.

* * * * *